(12) United States Patent
Liu et al.

(10) Patent No.: US 10,847,575 B2
(45) Date of Patent: Nov. 24, 2020

(54) METHOD AND RELATED APPARATUS FOR IMPROVING MEMORY CELL PERFORMANCE IN SEMICONDUCTOR-ON-INSULATOR TECHNOLOGY

(71) Applicant: Taiwan Semiconductor Manufacturing Co., Ltd., Hsin-Chu (TW)

(72) Inventors: Jack Liu, Taipei (TW); Charles Chew-Yuen Young, Cupertino, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 43 days.

(21) Appl. No.: 16/034,647

(22) Filed: Jul. 13, 2018

(65) Prior Publication Data
US 2020/0020742 A1  Jan. 16, 2020

(51) Int. Cl.
*H01L 27/22* (2006.01)
*H01L 43/02* (2006.01)
*G11C 11/16* (2006.01)
*G11C 13/00* (2006.01)

(52) U.S. Cl.
CPC ......... *H01L 27/228* (2013.01); *G11C 11/161* (2013.01); *G11C 11/1655* (2013.01); *G11C 11/1675* (2013.01); *H01L 43/02* (2013.01); *G11C 13/0004* (2013.01); *G11C 13/0011* (2013.01); *G11C 13/0069* (2013.01); *G11C 2213/79* (2013.01)

(58) Field of Classification Search
CPC ......... G11C 11/16; G11C 11/15; G11C 11/14; H01L 27/228; H01L 43/08
USPC .................................................. 365/158, 171
See application file for complete search history.

(56) References Cited

U.S. PATENT DOCUMENTS

| | | | |
|---|---|---|---|
| 9,130,520 B2* | 9/2015 | Mitsuishi | H03F 1/523 |
| 9,508,434 B2* | 11/2016 | Benoist | G11C 13/004 |
| 2018/0040668 A1* | 2/2018 | Park | G11C 11/161 |
| 2018/0151559 A1* | 5/2018 | Sio | H01L 27/0207 |

\* cited by examiner

*Primary Examiner* — Son T Dinh
(74) *Attorney, Agent, or Firm* — Eschweiler & Potashnik, LLC

(57) ABSTRACT

In some embodiments, a semiconductor device is provided. The semiconductor device includes a semiconductor substrate having a first semiconductor material layer separated from a second semiconductor material layer by an insulating layer. A first access transistor is arranged on the first semiconductor material layer, where the first access transistor has a pair of first source/drain regions having a first doping type. A second access transistor is arranged on the first semiconductor material layer, where the second access transistor has a pair of second source/drain regions having a second doping type opposite the first doping type. A resistive memory cell having a bottom electrode and an upper electrode is disposed over the semiconductor substrate, where one of the first source/drain regions and one of the second source/drain regions are electrically coupled to the bottom electrode.

20 Claims, 8 Drawing Sheets

METHOD AND RELATED APPARATUS FOR IMPROVING MEMORY CELL PERFORMANCE IN SEMICONDUCTOR-ON-INSULATOR TECHNOLOGY

BACKGROUND

Many modern day electronic devices contain electronic memory. Electronic memory may be volatile memory or non-volatile memory. Non-volatile memory is able to store data in the absence of power, whereas volatile memory is not. Some examples of next generation electronic memory include magnetoresistive random-access memory (MRAM), resistive random-access memory (RRAM), phase-change random-access memory (PCRAM), and conductive-bridging random-access memory (CBRAM). In some next generation electronic memory, an access transistor is coupled to a memory cell to control access to the memory cell during read and write operations. In some instances, the access transistor is arranged on a semiconductor-on-insulator (SOI) substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
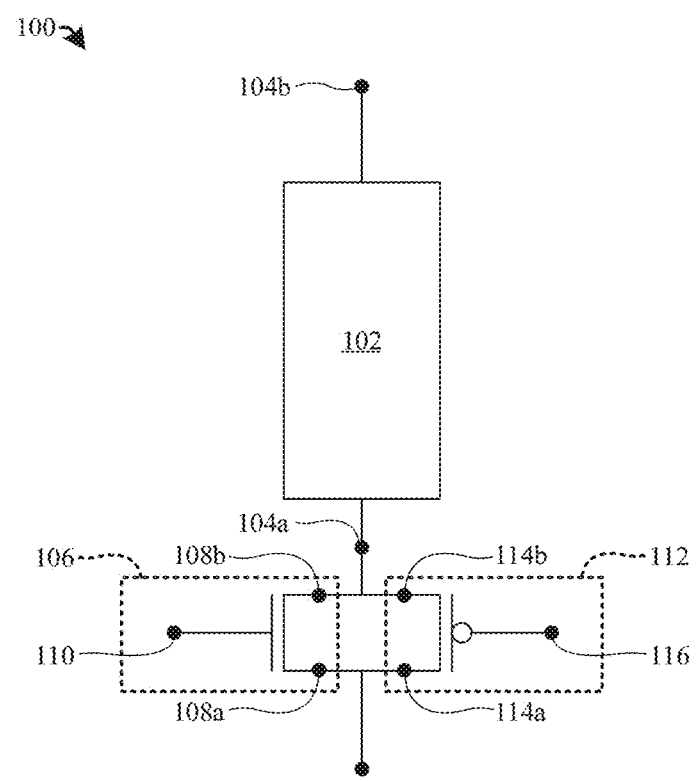
FIG. 1 illustrates a schematic diagram of some embodiments of a two transistor-one memory cell (2T1MC) electrical circuit having both a p-type channel metal-oxide-semiconductor (PMOS) access transistor and a n-type channel metal-oxide-semiconductor (NMOS) access transistor coupled to a resistive memory cell.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some next generation memory comprises a one transistor-one memory cell (1T1MC) device. The 1T1MC device may comprises a resistive memory cell and an access transistor. The resistive memory cell is configured to store data based on a resistive state of the resistive memory cell. For example, the data storage structure may have a low resistance state associated with a first data state (e.g., binary "0") or a high resistance state associated with a second data state (e.g., binary "1"). The access transistor is coupled to the resistive memory cell to control access to the resistive memory cell during read and write operations.

Depending on the current data state of the resistive memory cell, one of two write operations may be utilized to change the data state of the resistive memory cell. If the current data state of the resistive memory cell is the first data state, a first write current may be passed through the access transistor and then through the resistive memory cell to change the data state of the resistive memory cell to the second data state. Conversely, if the current data state of the resistive memory cell is the second data state, a second write current may be passed through the resistive memory cell and then through the access transistor to change the data state of the resistive memory cell to the first data state.

A challenge with the above 1T1MC device is passing the first write current and/or second write current through the resistive memory cell with sufficient current to ensure a successful write operation. For example, if the access transistor is a n-type channel metal-oxide-semiconductor (NMOS) access transistor, the NMOS access transistor may not pass the first write current with sufficient current to ensure a successful write operation because the NMOS access transistor passes a "weak 1" (e.g., because the NMOS access transistor is "on" when a gate to source voltage is greater than a threshold voltage). Conversely, if the access transistor is a p-type channel metal-oxide-semiconductor (PMOS) access transistor, the PMOS access transistor may not pass the second write current with sufficient current to ensure a successful write operation because the PMOS access transistor passes a "weak 0" (e.g., because the PMOS access transistor is "on" when a gate to source voltage is less than a threshold voltage). One possible solution to overcome this challenge is to apply an overdrive voltage (e.g., providing a voltage to a gate electrode of the access transistor that is greater than the threshold voltage of the access transistor) to the access transistor depending on the type of access transistor (e.g., NMOS or PMOS) and the write operation. However, overdriving the access transistor may negatively affect the reliability of the access transistor (e.g., exacerbating time-dependent gate oxide breakdown (TDDB), exacerbating hot carrier injection (HCI), etc.). Thus, the performance (e.g., number of available write cycles) of the 1T1MC device may be negatively affected.

In various embodiments, the present application is directed toward a two transistor-one memory cell (2T1MC) device having both a first access transistor and a second access transistor coupled to a resistive memory cell, where the first access transistor has a pair of first source/drain regions and the second access transistor has a pair of second source/drain regions having a different doping type than the pair of first source/drain regions. The resistive memory cell comprises a first terminal and a second terminal. One of the first source/drain regions is coupled to the first terminal, and one of the second source/drain regions is coupled to the first terminal. Another one of the first source/drain regions and another one of the second source/drain regions are coupled together. Because the doping type of the pair of first source/drain regions is opposite the doping type of the second source/drain regions and because the first source/drain regions and second source/drain regions are arranged as described above, a write current having sufficient current to ensure a successful write operation may be passed through the resistive memory cell without overdriving the first or second access transistor. Thus, the reliability of the first access transistor and second access transistor may be improved. Accordingly, the performance (e.g., number of available write cycles) of the 2T1MC device may be improved over the 1T1MC device.

FIG. 1 illustrates a schematic diagram of some embodiments of a two transistor-one memory cell (2T1MC) electrical circuit 100 having both a p-type channel metal-oxide-semiconductor (PMOS) access transistor and a n-type channel metal-oxide-semiconductor (NMOS) access transistor coupled to a resistive memory cell.

As shown in FIG. 1, the 2T1MC electrical circuit 100 comprises a resistive memory cell 102. The resistive memory cell 102 is configured to store data based on a resistive state of the resistive memory cell 102. For example, the resistive memory cell 102 may have a low resistance state associated with a first data state (e.g., binary "0") and a high resistance state associated with a second data state (e.g., binary "1"). The resistive memory cell 102 comprises a first resistive memory cell terminal 104a and a second resistive memory cell terminal 104b.

An NMOS access transistor 106 is coupled to the resistive memory cell 102. The NMOS access transistor 106 is configured to control access to the resistive memory cell during read and write operations. The NMOS access transistor 106 comprises a first NMOS source/drain terminal 108a and a second NMOS source/drain terminal 108b. The second NMOS source/drain terminal 108b is coupled to the first resistive memory cell terminal 104a. Further, the NMOS access transistor 106 comprises a NMOS gate terminal 110.

A PMOS access transistor 112 is also coupled to the resistive memory cell 102. The PMOS access transistor 112 is configured to control access to the resistive memory cell during read and write operations. The PMOS access transistor 112 comprises a first PMOS source/drain terminal 114a and a second PMOS source/drain terminal 114b. The second PMOS source/drain terminal 114b is coupled to the first resistive memory cell terminal 104a. The first PMOS source/drain terminal 114a is coupled to the first NMOS source/drain terminal 108a. Further, the PMOS access transistor 112 comprises a PMOS gate terminal 116.

In some embodiments, a first write operation or a second write operation may be performed to change a data state of the resistive memory cell 102 depending on the current data state of the resistive memory cell 102. The first write operation may be configured to switch the resistive memory cell 102 from the first data state to the second data state, while the second write operation may be configured to switch the resistive memory cell 102 from the second data state to the first data state. During the first write operation, a first bias voltage (e.g., 1.2 volts (V)) may be applied to both the first PMOS source/drain terminal 114a and the first NMOS source/drain terminal 108a, and the second resistive memory cell terminal 104b may be coupled to ground (e.g., about 0 V). Conversely, during the second write operation, a second bias voltage (e.g., 1.2 V) may be applied to the second resistive memory cell terminal 104b, and the first PMOS source/drain terminal 114a and the first NMOS source/drain terminal 108a may be coupled to ground (e.g., about 0 V). During both the first write operation and the second write operation, the NMOS gate terminal 110 may be coupled to a third bias voltage (e.g., 1.2 V) and the PMOS gate terminal 116 may be coupled to ground (e.g., about 0 V).

Because both the second NMOS source/drain terminal 108b and the second PMOS source/drain terminal 114b are coupled to the first resistive memory cell terminal 104a and because the first NMOS source/drain terminal 108a and the first PMOS source/drain terminal 114a are coupled together, a write current may be passed through the resistive memory cell 102 with sufficient current during both the first write operation and the second write operation current to change the data state of the resistive memory cell 102. For example, during the first write operation, a first write current may be passed through the PMOS access transistor 112 and then through the resistive memory cell 102 with sufficient current to change the data state of the resistive memory cell 102 because the PMOS passes a "strong 1" while the NMOS passes a "weak 1." Conversely, during the second write operation, a second write current may be passed through the resistive memory cell and then through the NMOS access transistor 106 with sufficient current to change the data state of the resistive memory cell 102 because the NMOS passes a "strong 0" while the PMOS passes a "weak 0." Accordingly, performance (e.g., number of available write cycles) of the 2T1MC electrical circuit 100 may be improved over a one transistor-one memory cell (1T1MC) electrical circuit.

Figure 2A:
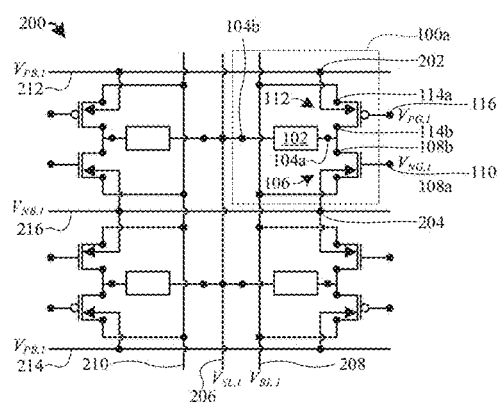
FIGS. 2A-2C illustrate various schematic diagrams of some embodiments of a memory array electrical circuit having a plurality of the two transistor-one memory cell (2T1MC) electrical circuits of FIG. 1 coupled together in rows and columns, where the PMOS access transistors of FIG. 1 and the NMOS access transistors of FIG. 1 respectively comprise a PMOS body terminal and a NMOS body terminal.
Figure 2B:
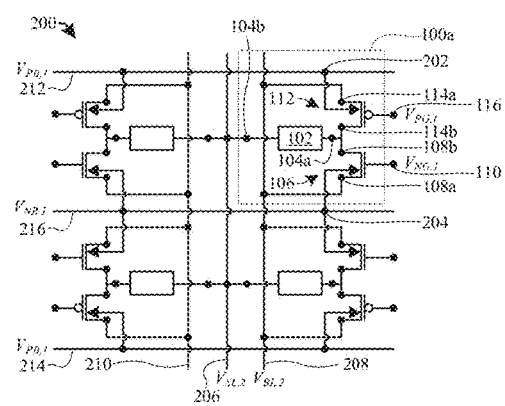
Figure 2C:
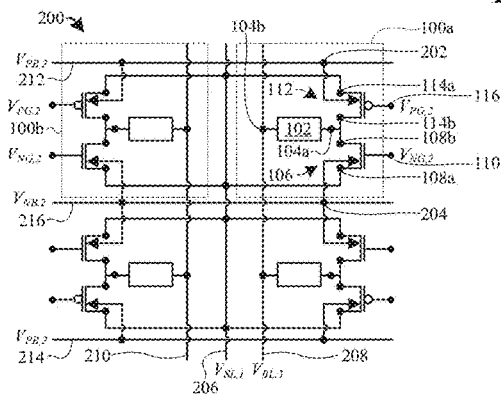

FIGS. 2A-2C illustrate various schematic diagrams of some embodiments of a memory array electrical circuit 200 having a plurality of the two transistor-one memory cell (2T1MC) electrical circuits 100 of FIG. 1 coupled together in rows and columns, where the PMOS access transistors of FIG. 1 and the NMOS access transistors of FIG. 1 respectively comprise a PMOS body terminal and a NMOS body terminal.

As shown in FIGS. 2A-2C, the PMOS access transistor 112 of each 2T1MC electrical circuit 100 respectively comprises a PMOS body terminal 202. In some embodiments, the PMOS body terminal 202 is configured to receive a body bias voltage that may alter the electrical properties (e.g., threshold voltage) of the PMOS access transistor 112. Further, the NMOS access transistor 106 of each 2T1MC electrical circuit 100 respectively comprises a NMOS body terminal 204. In some embodiments, the NMOS body terminal 204 is configured to receive a body bias voltage that may alter the electrical properties (e.g., threshold voltage) of the NMOS access transistor 106.

In some embodiments, a select line 206 is coupled to the second resistive memory cell terminal 104b of each 2T1MC electrical circuit 100. A first bit line 208 may be coupled to the first PMOS source/drain terminal 114a and the first NMOS source/drain terminal 108a of some of the plurality of 2T1MC electrical circuits 100 along a first column of the memory array electrical circuit 200. A second bit line 210 may be coupled to the first PMOS source/drain terminal 114a and the first NMOS source/drain terminal 108a of some other of the plurality of 2T1MC electrical circuits 100 along a second column of the memory array electrical circuit 200. A first PMOS body line 212 may be coupled to the PMOS body terminal 202 of some of the plurality of 2T1MC electrical circuits 100 along a first row of the memory array electrical circuit 200. A second PMOS body line 214 may be coupled to the PMOS body terminal 202 of some other of the plurality of 2T1MC electrical circuits 100 along a second row of the memory array electrical circuit 200. A NMOS body line 216 may be coupled to the NMOS body terminal 204 of the 2T1MC electrical circuits 100 along the first row and the second row of the memory array electrical circuit 200. The select line 206, the first bit line 208, the second bit line 210, the first PMOS body line 212, the second PMOS body line 214, and the NMOS body line 216 are configured to selectively provide a voltage to the terminals in which they are coupled.

As shown in FIG. 2A, a first write operation is being performed on a first 2T1MC electrical circuit 100a. The first write operation is configured to switch the resistive memory cell 102 of the first 2T1MC electrical circuit 100a from a first data state (e.g., a high resistance state) to a second data state (e.g., a low resistance state). During the first write operation, a first PMOS gate voltage $V_{PG,1}$ is applied to the PMOS gate terminal 116 (e.g., via a first word line). The first PMOS gate voltage $V_{PG,1}$ is configured to turn the PMOS access transistor 112 "on" (e.g., to form a conductive path between the first PMOS source/drain terminal 114a and the second PMOS source/drain terminal 114b). In some embodiments, the first PMOS gate voltage $V_{PG,1}$ is ground (e.g., about 0 V).

A first NMOS gate voltage $V_{NG,1}$ is applied to the NMOS gate terminal 110 (e.g., via the first word line or a second word line). The first NMOS gate voltage $V_{NG,1}$ is configured to turn the NMOS access transistor 106 "on" (e.g., to form a conductive path between the first NMOS source/drain terminal 108a and the second NMOS source/drain terminal 108b). In some embodiments, the first NMOS gate voltage $V_{NG,1}$ is about 1.2 V.

A first bit line voltage $V_{BL,1}$ is applied to the first PMOS source/drain terminal 114a and the first NMOS source/drain terminal 108a via the first bit line 208. A first select line voltage $V_{SL,1}$ is applied to the second resistive memory cell terminal 104b of the first 2T1MC electrical circuit 100a via the select line 206. The first bit line voltage $V_{BL,1}$ and the first select line $V_{SL,1}$ voltage are configured such that a first write current may pass through the resistive memory cell 102 to change the data state of the resistive memory cell from the first data state to the second data state. In some embodiments, the first bit line voltage $V_{BL,1}$ is about 1.2 V. In some embodiments, the first select line voltage $V_{SL,1}$ is ground (e.g., about 0 V).

In some embodiments, the second bit line 210 is floating to reduce power consumption of the memory array electrical circuit 200. In further embodiments, "off state" gate voltages are respectively applied to the PMOS gate terminal 116 and the NMOS gate terminal 110 of other 2T1MC electrical circuits 100 coupled to the first bit line 208, such that the data state of the resistive memory cell 102 of the first 2T1MC electrical circuit 100a is selectively switched from the first data state to the second data state. In yet further embodiment's, the "off state" gate voltage applied to the PMOS gate terminal 116 is about 1.2 V, and the "off state" gate voltage applied to the NMOS gate terminal 110 is ground (e.g., about 0 V).

A first PMOS body bias voltage $V_{PB,1}$ is applied to the PMOS body terminal 202 via the first PMOS body line 212. The first PMOS body bias voltage $V_{PB,1}$ may increase the amount of first write current that passes through the PMOS access transistor 112. In some embodiments, the first PMOS body bias voltage $V_{PB,1}$ is about negative 2 V. In further embodiments, the first PMOS body bias voltage $V_{PB,1}$ is also applied to the second PMOS body line 214. Further, a first NMOS body bias voltage $V_{NB,1}$ is applied to the NMOS body terminal 204 via the NMOS body line 216. The first NMOS body bias voltage $V_{NB,1}$ may increase the amount of first write current that passes through the NMOS access transistor 106. In some embodiments, the first NMOS body bias voltage $V_{NB,1}$ is about 2 V.

As shown in FIG. 2B, a second write operation is being performed on the first 2T1MC electrical circuit 100a. The second write operation is configured to switch the resistive memory cell 102 of the first 2T1MC electrical circuit 100a from the second data state (e.g., a low resistance state) to the first data state (e.g., a high resistance state). During the second write operation, a second bit line voltage $V_{BL,2}$ is applied to the first PMOS source/drain terminal 114a and the first NMOS source/drain terminal 108a via the first bit line 208. A second select line voltage $V_{SL,2}$ is applied to the second resistive memory cell terminal 104b via the select line 206. The second bit line voltage $V_{BL,2}$ and the second select line voltage $V_{SL,2}$ are configured such that a second write current may pass through the resistive memory cell 102 to change the data state of the resistive memory cell 102 from the second data state to the first data state. In some embodiments, the second bit line voltage $V_{BL,2}$ is ground (e.g., about 0 V). In some embodiments, the second select line voltage $V_{SL,2}$ is about 1.2 V.

As shown in FIG. 2C, a read operation is being performed on the first 2T1MC electrical circuit 100a. The read operation is configured to probe the resistance of the resistive memory cell 102 (e.g., to determine if the resistive memory cell 102 is in a low resistance state or a high resistance state) of the first 2T1MC electrical circuit 100a to determine the data state of the resistive memory cell 102 of the first 2T1MC electrical circuit 100a. During the read operation, a second PMOS gate voltage $V_{PG,2}$ is applied to the PMOS gate terminal 116 of the first 2T1MC electrical circuit 100a. In some embodiments, the second PMOS gate voltage $V_{PG,2}$ is about 0.8 V. Further, a second NMOS gate voltage $V_{NG,2}$ is applied to the NMOS gate terminal 110 of the first 2T1MC electrical circuit 100a. In some embodiments, the second NMOS gate voltage $V_{NG,2}$ is about 0.8 V. In further embodiments, the second PMOS gate voltage $V_{PG,2}$ and the second NMOS gate voltage $V_{NG,2}$ are respectively applied to the PMOS gate terminal 116 and the NMOS gate terminal 110 of a second 2T1MC electrical circuit 100b.

In some embodiments, the first select line voltage $V_{BL,1}$ is applied to the first PMOS source/drain terminal 114a and the first NMOS source/drain terminal 108a of the first 2T1MC electrical circuit 100a. A third bit line voltage $V_{BL,3}$ is applied to the second terminal of the resistive memory cell 102 of the first 2T1MC electrical circuit 100a. The third bit line voltage $V_{BL,3}$ and the first select line $V_{SL,1}$ voltage are configured such that a read current may respectively pass through the resistive memory cell 102 of the first 2T1MC electrical circuit 100a depending on the data state of the respective resistive memory cell 102. In some embodiments, the third bit line voltage $V_{BL,3}$ is about 0.8 V.

In some embodiments, the first select line voltage $V_{SL,1}$ is applied to a first PMOS source/drain terminal 114a and a first NMOS source/drain terminal 108a of the second 2T1MC electrical circuit 100b. In further embodiments, "off state" gate voltages (e.g., about 0 V) may be respectively applied to the NMOS gate terminal 110 of other 2T1MC electrical circuits 100 coupled to the first bit line 208, such that the resistance of the resistive memory cells 102 of the first 2T1MC electrical circuit 100a is selectively probed. In further embodiments, the second bit line 210 is floating to selectively probe the resistance of the resistive memory cell 102 of the first 2T1MC electrical circuit 100a and to reduce power consumption of the memory array electrical circuit 200.

A second PMOS body bias voltage $V_{PB,2}$ is applied to the PMOS body terminal 202 of the first 2T1MC electrical circuit 100a via the first PMOS body line 212. The second PMOS body bias voltage $V_{PB,2}$ may reduce leakage current that may pass through the PMOS access transistor 112 during the read operation. In some embodiments, the second PMOS body bias voltage $V_{PB,2}$ is about 2 V. Further, a second NMOS body bias voltage $V_{NB,2}$ is applied to the NMOS body terminal 204 of the first 2T1MC electrical circuit 100a via the NMOS body line 216. In some embodiments, the second NMOS body bias voltage $V_{NB,2}$ is ground (e.g., about 0 V). The second NMOS body bias voltage $V_{NB,2}$ may increase the amount of read current that passes through the NMOS access transistor 106 without substantially increasing leakage current that may pass through the NMOS access transistor 106. In further embodiments, the second PMOS body bias voltage $V_{PB,2}$ may be applied to the second PMOS body line 214.

Regardless of the operation being performed on the memory array electrical circuit 200 (e.g., first write operation, second write operation, or read operation), the performance of the memory array electrical circuit 200 may be improved because the PMOS body terminal 202 and the NMOS body terminal 204 may independently receive varying body bias voltages (e.g., $V_{PB,1}$, $V_{PB,2}$, $V_{NB,1}$, $V_{NB,2}$). For example, during the first write operation, the first PMOS body bias voltage $V_{PB,1}$ may be applied to the PMOS body terminal 202 to increase the amount of first write current that passes through the PMOS access transistor 112. During the second write operation, the first NMOS body bias voltage $V_{NB,1}$ may be applied to the NMOS body terminal 204 to increase the amount of second write current that passes through the NMOS access transistor 106. During the read operation, because applying the second PMOS body bias voltage $V_{PB,2}$ may reduce leakage current and because applying the second NMOS body bias voltage $V_{NB,2}$ may increase the amount of read current that passes through the NMOS access transistor 106 without substantially increasing leakage current that may pass through the NMOS access transistor 106, the density of 2T1MC electrical circuits 100 disposed on a semiconductor substrate may be increased.

Figure 3A:
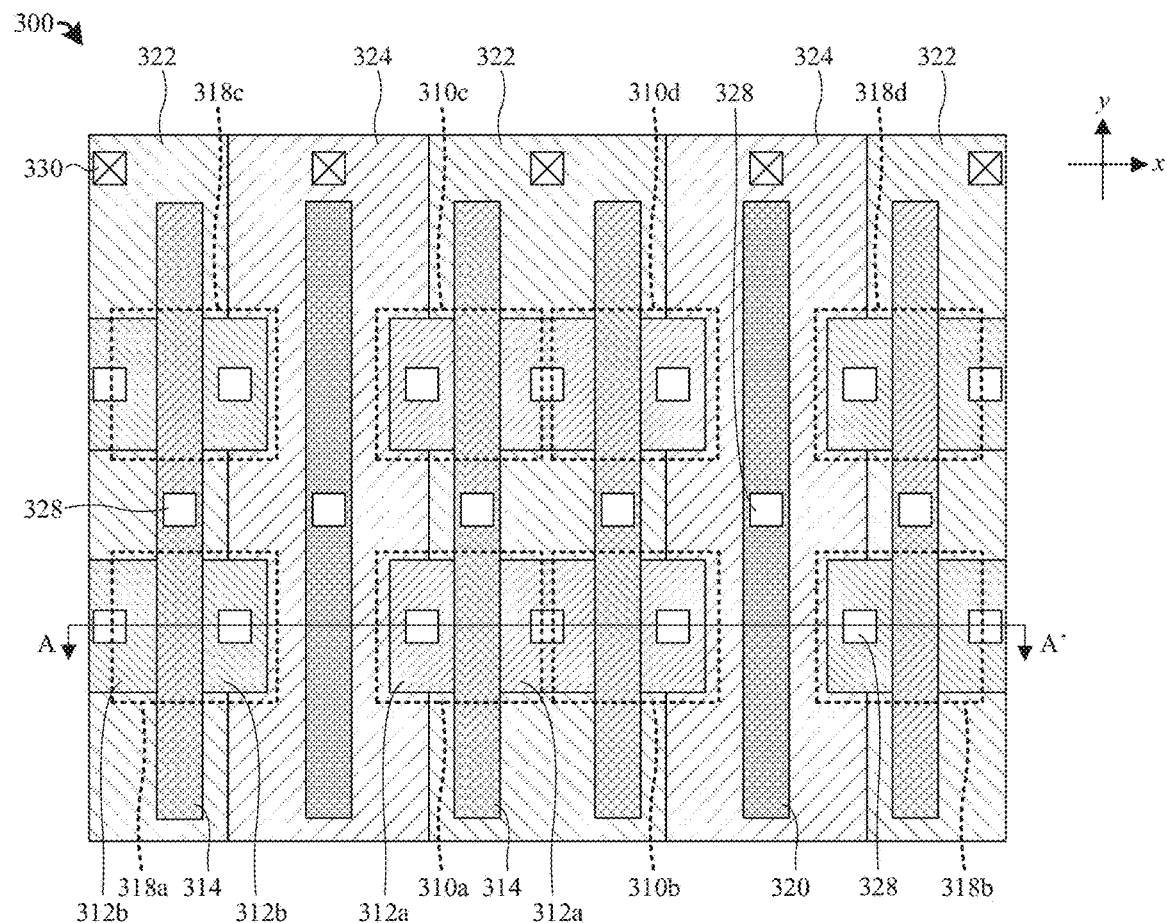
FIGS. 3A-3B illustrate various views of some embodiments of an integrated circuit (IC) having a two transistor-one memory cell (2T1MC) device, where a first access transistor has first source/drain regions having a different doping type than second source/drain regions of a second access transistor.
Figure 3B:
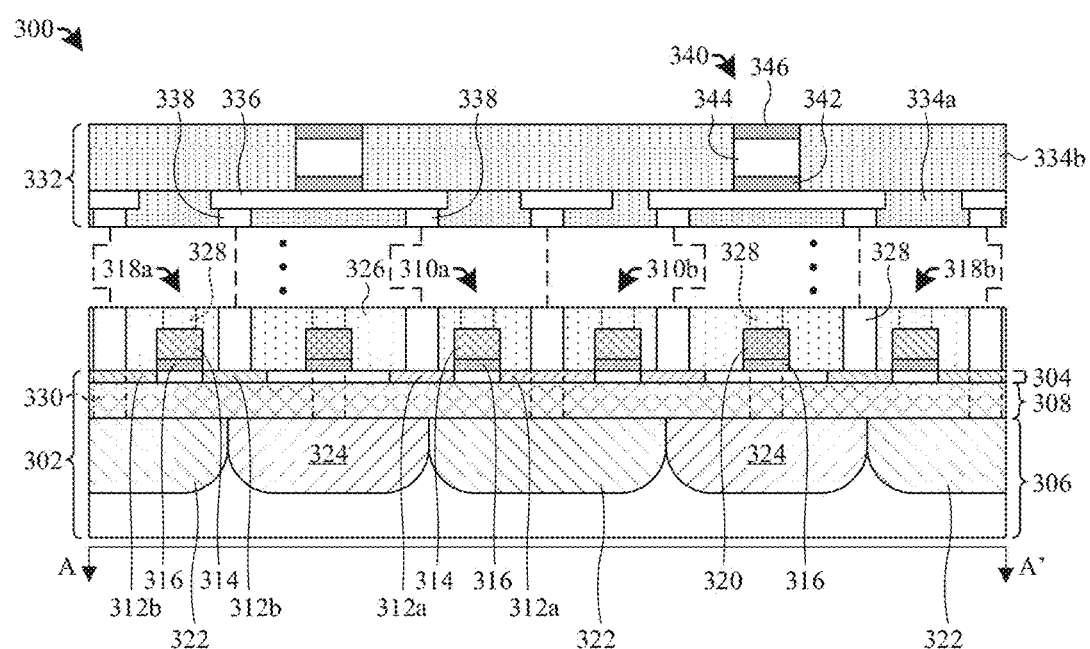

FIGS. 3A-3B illustrate various views of some embodiments of an integrated circuit (IC) 300 having a two transistor-one memory cell (2T1MC) device, where a first access transistor has first source/drain regions having a different doping type than second source/drain regions of a second access transistor. FIG. 3A illustrates a top view of some embodiments of the IC 300. FIG. 3B illustrates a cross-sectional view of some embodiments of the IC 300 taken along line A-A' of FIG. 3A.

As shown in FIGS. 3A-3B, the IC 300 comprises a semiconductor substrate 302. In some embodiments, the semiconductor substrate 302 comprises a first semiconductor material layer 304 vertically separated from a second semiconductor material layer 306 by an insulating layer 308. In some embodiments, the semiconductor substrate 302 is a semiconductor-on-insulator (SOI) substrate. In some embodiments, the semiconductor substrate 302 may be a fully-depleted semiconductor-on-insulator (FDSOI) substrate that comprises a first semiconductor material layer 304 having a first semiconductor material thickness. In further embodiments, the semiconductor substrate 302 may be a partially-depleted semiconductor-on-insulator (PDSOI) that comprises a first semiconductor material layer 304 having a second semiconductor material thickness that is greater than the first semiconductor material thickness. In further embodiments, the first semiconductor material layer 304 may comprise an intrinsic semiconductor material (e.g., undoped silicon). In other embodiments, the first semiconductor material layer 304 may comprise a doped semiconductor material (e.g., p-type doped silicon).

A plurality of p-type channel metal-oxide-semiconductor (PMOS) access transistors 310a-d are disposed on the semiconductor substrate 302. In some embodiments, the plurality of PMOS access transistors 310a-d comprise a first PMOS access transistor 310a, a second PMOS access transistor 310b, a third PMOS access transistor 310c, and a fourth PMOS access transistor 310d. In further embodiments, the first PMOS access transistor 310a and the second PMOS access transistor 310b neighbor one another in a first direction (e.g., along x axis), and the third PMOS access transistor 310c and the fourth PMOS access transistor 310d neighbor one another in the first direction. In yet further embodiments, the first PMOS access transistor 310a and the second PMOS access transistor 310b are spaced apart from the third PMOS access transistor 310c and the fourth PMOS access transistor 310d in a second direction (e.g., along y axis) transverse the first direction.

The PMOS access transistors 310a-d respectively comprise a pair of first source/drain regions 312a. The first source/drain regions 312a are laterally spaced from one another in the first direction. In some embodiments, the first source/drain regions 312a may comprise a first doping type (e.g., p-type doping). In further embodiments, the first PMOS access transistor 310a and the second PMOS access transistor 310b may share a common first source/drain region 312a. In yet further embodiments, the third PMOS access transistor 310c and the fourth PMOS access transistor 310d may share a common first source/drain region 312a.

Further, the PMOS access transistors 310a-d respectively comprise a gate electrode 314 and a gate dielectric 316. The gate electrode 314 is disposed between respective first source/drain regions 312a. The gate dielectric 316 underlies the gate electrode 314 and separates the gate electrode 314 from the first semiconductor material layer 304. In some embodiments, the gate electrode 314 may continuously extend in the second direction between first source/drain regions 312a of the first PMOS access transistor 310a and between first source/drain regions 312a of the third PMOS access transistor 310c. In further embodiments, another gate electrode 314 may continuously extend in the second direction between first source/drain regions 312a of the second PMOS access transistor 310b and between first source/drain regions 312a of the fourth PMOS access transistor 310d.

A plurality of n-type channel metal-oxide-semiconductor (NMOS) access transistors 318a-d are disposed on the semiconductor substrate 302. In some embodiments, the plurality of NMOS access transistors 318a-d comprises a first NMOS access transistor 318a, a second NMOS access transistor 318b, a third NMOS access transistor 318c, and a fourth NMOS access transistor 318d. In further embodiments, the first NMOS access transistor 318a is spaced from the third NMOS access transistor 318c in the second direction, and the second NMOS access transistor 318b is spaced from the fourth NMOS access transistor 318d in the second direction. In yet further embodiments, the first NMOS access transistor 318a is spaced from the second NMOS access transistor 318b in the first direction by the first PMOS access transistor 310a and the second PMOS access transistor 310b, and the third NMOS access transistor 318c is spaced from the fourth NMOS access transistor 318d in the first direction by the third PMOS access transistor 310c and the fourth PMOS access transistor 310d.

The NMOS access transistors 318a-d respectively comprise a pair of second source/drain regions 312b. The second source/drain regions 312b are laterally spaced from one another in the first direction. In some embodiments, the second source/drain regions 312b may comprise a second doping type (e.g., n-type doping) opposite the first doping type. In further embodiments, the NMOS access transistors 318a-d may respectively share a common second source/drain region 312b with additional NMOS access transistors (not shown) that respectively neighbor the NMOS access transistors 318a-d.

Further, the NMOS access transistors 318a-d respectively comprise a gate electrode 314 and a gate dielectric 316. The gate electrode 314 is disposed between respective second source/drain regions 312b. The gate dielectric 316 underlies the gate electrode 314 and separates the gate electrode 314 from the first semiconductor material layer 304. In some embodiments, the gate electrode 314 may continuously extend in the second direction between second source/drain regions 312b of the first NMOS access transistor 318a and between second source/drain regions 312b of the third NMOS access transistor 318c. In further embodiments, another gate electrode 314 may continuously extend in the second direction between second source/drain regions 312b of the second NMOS access transistor 318b and between second source/drain regions 312b of the fourth NMOS access transistor 318d.

A plurality of dummy gates 320 are disposed over the first semiconductor material layer 304. The dummy gates 320 are respectively disposed between one of the PMOS access transistors 310a-d and one of the NMOS access transistors 318a-d. In some embodiments, the dummy gates 320 may continuously extend in the second direction between two of the PMOS access transistors 310a-d and two of the NMOS access transistors 318a-d, respectively. In further embodiments, gate dielectrics 316 respectively underlie the dummy gates 320 and separate the dummy gates 320 from the first semiconductor material layer 304.

A plurality of biasing wells 322 are disposed in the second semiconductor material layer 306. The biasing wells 322 are configured to receive a body bias voltage between about 2 V and about negative 2 V. The biasing wells 322 respectively underlie the PMOS access transistors 310a-d and the NMOS access transistors 318a-d. In some embodiments, the biasing wells 322 are discrete regions of the second semiconductor material layer 306. In other embodiments, the biasing wells 322 are part of a continuous region of the second semiconductor material layer 306. In further embodiments, the biasing wells 322 respectively contact the insulating layer 308 in a vertical direction beneath the PMOS access transistors 310a-d and/or the NMOS access transitions 318a-d. In yet further embodiments, the biasing wells 322 comprise the first doping type (e.g., p-type doping).

A plurality of isolation wells 324 are disposed in the second semiconductor material layer 306. The isolation wells 324 are configured to receive an isolation voltage (e.g., 2 V) to provide isolation between the biasing wells 322. The isolation wells 324 respectively separate the biasing wells 322 from one another. In some embodiments, the isolation wells 324 respectively underlie the dummy gates 320. In further embodiments, the isolation wells 324 contact the insulating layer 308 in a vertical direction beneath the dummy gates 320. In yet further embodiments, the isolation wells 324 comprise the second doping type (e.g., n-type doping) opposite the first doping type.

Because the biasing wells 322 are disposed beneath the PMOS access transistors 310a-d and the NMOS access transistors 318a-d and because the biasing wells 322 are isolated by the isolation wells 324, the biasing wells 322 may receive independent body bias voltages to selectively improve the electrical properties (e.g., leakage current, output current, switching speed, etc.) of the PMOS access transistors 310a-d and/or the NMOS access transistors 318a-d. Accordingly, write and read operations may be improved (e.g., by increasing output current) and/or the density of PMOS access transistors 310a-d and NMOS access transistors 318a-d disposed on the semiconductor substrate 302 may be improved (e.g., by improving leakage current between devices).

An interlayer dielectric (ILD) layer 326 is disposed over the first semiconductor material layer 304, the PMOS access transistors 310a-d, and the NMOS access transistors 318a-d. A plurality of contacts 328 are disposed in the ILD layer 326. In some embodiments, the contacts 328 extend through the ILD layer to respectively contact the first source/drain regions 312a, the second source/drain regions 312b, and the gate electrodes 314. In further embodiments, the contacts 328 respectively extend through the ILD layer 326 and contact the dummy gates 320. In other embodiments, the contacts 328 do not extend through the ILD layer 326 to contact the dummy gates 320.

Further, a plurality of body contacts 330 are disposed in the ILD layer 326. The body contacts 330 extend through the ILD layer 326, the first semiconductor material layer 304, and the insulating layer 308 to respectively contact the biasing wells 322 and the isolation wells 324. The body contacts 330 are configured to respectively provide electrical connections to the biasing wells 322 and the isolation wells 324, such that the biasing wells 322 may be independently coupled to body bias voltages (e.g., voltages between about 2 V and negative 2 V) and the isolation wells may be coupled to an isolation voltage (e.g., about 2 V).

An interconnect structure 332 is disposed over the ILD layer 326. The interconnect structure 332 comprises a plurality of inter-metal dielectric (IMD) layers 334a-b. The plurality of IMD layers 334a-b may comprise a first IMD layer 334a and a second IMD layer 334b. A plurality of conductive wires 336 and a plurality of conductive vias 338 are disposed in the first IMD layer 334a. The conductive wires 336 and conductive vias 338 are configured to provide electrical connections between various devices disposed throughout the IC 300. In some embodiments, a first one of the conductive vias 338 couples a contact 328 coupled to one of the second source/drain regions 312b to one of the conductive wires 336. Further, a second one of the conductive vias 338 couples a contacts 328 coupled to one of the first source/drain regions 312a to the one of the conductive wires 336, such that both the one of the second source/drain regions 312b and the one of the first source/drain regions 312a are electrically coupled to the one of the conductive wires 336.

A plurality of resistive memory cells 340 are disposed in the interconnect structure 332. In some embodiments, the resistive memory cells 340 are disposed in the second IMD layer 334b. The resistive memory cells 340 are respectively configured to store data based on a resistive state of the resistive memory cells 340. In some embodiments, the resistive memory cells 340 may respectively comprise a bottom electrode 342, a data storage structure 344, and an upper electrode 346. In some embodiments, the bottom electrode 342 of one of the resistive memory cells 340 may be coupled to the one of the conductive wires 336, such that the one of the second source/drain regions 312b and the one of the first source/drain regions 312a are electrically coupled to the bottom electrode 342 of one of the resistive memory cells 340. In further embodiments, the bottom electrode 342 of each resistive memory cell 340 is coupled to a second source/drain region 312b and a first source/drain region 312a.

In some embodiments, the resistive memory cell 340 may be, for example, a magnetoresistive random-access memory (MRAM) cell, resistive random-access memory (RRAM) cell, phase-change random-access memory (PCRAM) cell, or conductive-bridging random-access memory (CBRAM) cell. More specifically, the resistive memory cell 340 may be a spin-transfer torque magnetoresistive random-access memory (STT-MRAM) cell. In further embodiments, the interconnect structure 332 may comprise additional IMD layers 334 (not shown), additional conductive wires 336 (not shown), and additional conductive vias 338 (not shown) disposed between the first IMD layer 334a and the ILD layer 326. In yet further embodiments, the interconnect structure 332 may comprise additional IMD layers 334 (not shown), additional conductive wires 336 (not shown), and additional conductive vias 338 (not shown) disposed over the resistive memory cell 340, such that the additional conductive wires 336 and additional conductive vias 338 respectively provide electrical connections between the upper electrode 346 and input/output structures (e.g., solder bumps) (not shown) of the IC 300.

Figure 4:
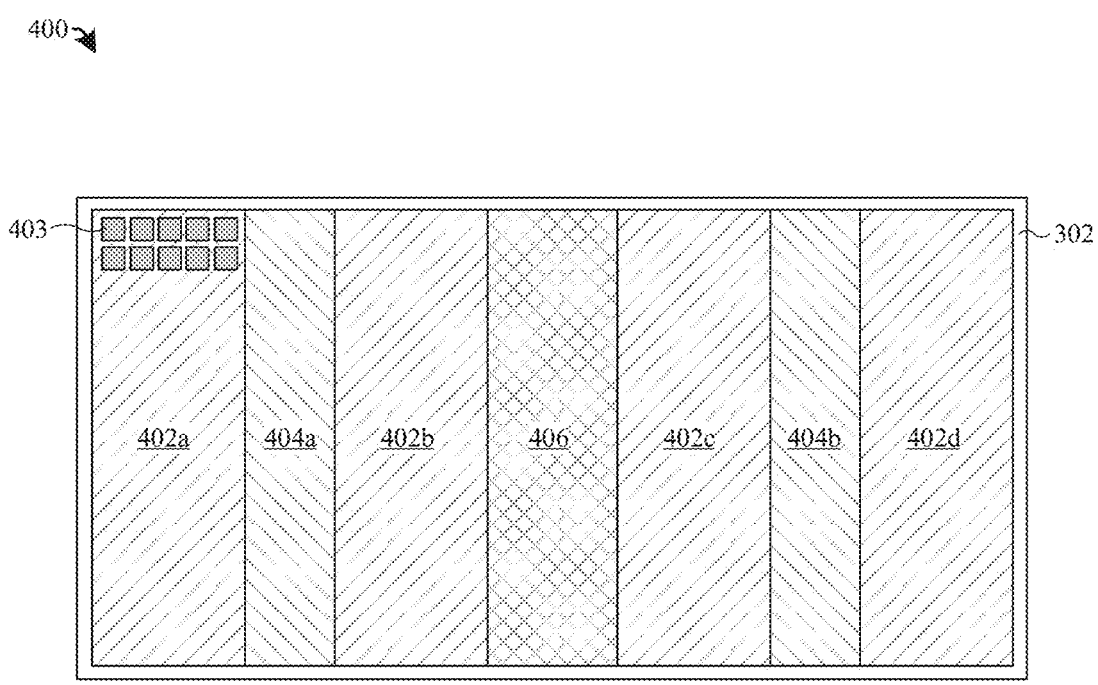
FIG. 4 illustrates a layout view of some embodiments of an integrated circuit (IC) having a plurality of memory arrays each having a plurality of the two transistor-one memory cell (2T1MC) devices of FIGS. 3A-3B.

FIG. 4 illustrates a layout view of some embodiments of an integrated circuit (IC) 400 having a plurality of memory arrays each having a plurality of two transistor-one memory cells (2T1MC) of FIGS. 3A-3B.

As shown in FIG. 4, a plurality of memory arrays 402a-d are disposed on a semiconductor substrate 302. In some embodiments, the plurality of memory arrays 402a-d comprises a first memory array 402a, a second memory array 402b, a third memory array 403c, and a fourth memory array 402d. The memory arrays 402a-d respectively comprise a plurality of 2T1MC devices 403 arranged in a plurality of rows and columns. In some embodiment, each row or column may comprise, for example, 8, 16, 32, 64, 128, 256, 512, 1024, etc. 2T1MC devices 403. In further embodiments, the memory arrays 402a-d may respectively comprise, for example, 8, 16, 32, 64, 128, 256, 512, 1024, etc. rows or columns.

In some embodiments, a first select line/bit line driver circuit 404a may be disposed between the first memory array 402a and the second memory array 402b. A second select line/bit line driver circuit 404b may be disposed between the third memory array 402c and the fourth memory array 402d. The first select line/bit line driver circuit 404a and the second select line/bit line driver circuit 404b are configured to send electrical signals to the 2T1MC devices 403 of the memory arrays 402a-d. In further embodiments, a sense amplifier 406 circuit may be disposed between the second memory array 402b and the third memory array 402c. The sense amplifier 406 is configured to receive and amplify electrical signals from the 2T1MC devices 403 of the memory arrays 402a-d.

FIGS. 5 through 11 illustrate a series of cross-sectional views of some embodiments of a method for forming an integrated circuit (IC) having a two transistor-one memory cell (2T1MC), where a first access transistor has first source/drain regions having a different doping type than second source/drain regions of a second access transistor.

Figure 5:
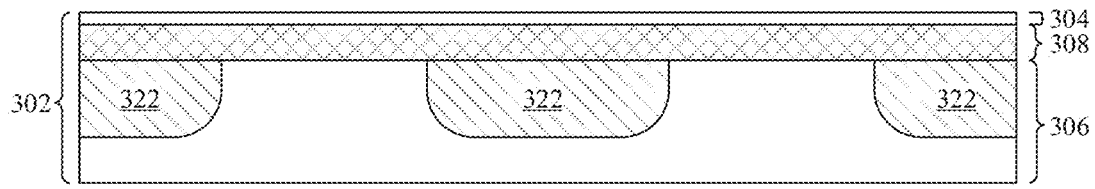
FIGS. 5 through 11 illustrate a series of cross-sectional views of some embodiments of a method for forming an integrated circuit (IC) having a two transistor-one memory cell (2T1MC) device, where a first access transistor has first source/drain regions having a different doping type than second source/drain regions of a second access transistor.

As shown in FIG. 5, a plurality of biasing wells 322 are formed in a semiconductor substrate 302. The biasing wells 322 are formed in a second semiconductor material layer 306 that is separated from a first semiconductor material layer 304 by an insulating layer 308. The biasing wells 322 are regions of the second semiconductor material layer 306 comprising a first doping type (e.g., p-type doping). In various embodiments, the biasing wells 322 may be formed by a selective ion implantation process that utilizes a masking layer (not shown) to selectively implant ions into the second semiconductor material layer 306. In other embodiments, the biasing wells 322 may be formed by a blanket ion implantation process (e.g., an unmasked ion implantation) to implant ions into the second semiconductor material layer 306. In further embodiments, the biasing wells 322 are formed after active regions (e.g., doped regions disposed in the first semiconductor material layer 304) have been defined in the first semiconductor material layer 304.

Figure 6:
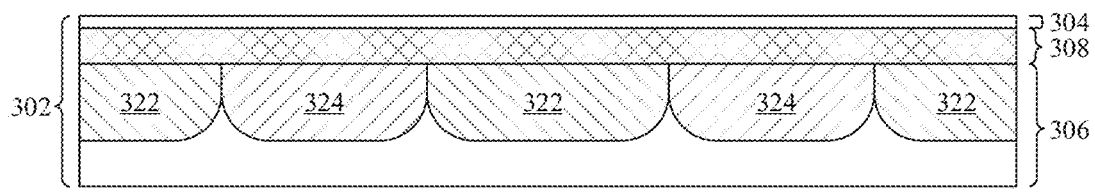

As shown in FIG. 6, a plurality of isolation wells 324 are formed in the second semiconductor material layer 306. The isolation wells 324 are formed between respective biasing wells 322. The isolation wells 324 are regions of the second semiconductor material layer 306 comprising a second doping type (e.g., n-type doping) opposite the first doping type. In various embodiments, the isolation wells 324 may be formed by a selective ion implantation process that utilizes a masking layer (not shown) to selectively implant ions into the second semiconductor material layer 306. In further embodiments, the isolation wells 324 may be formed in the second semiconductor material layer 306 before the biasing wells 322 are formed in the second semiconductor material layer 306.

Figure 7:
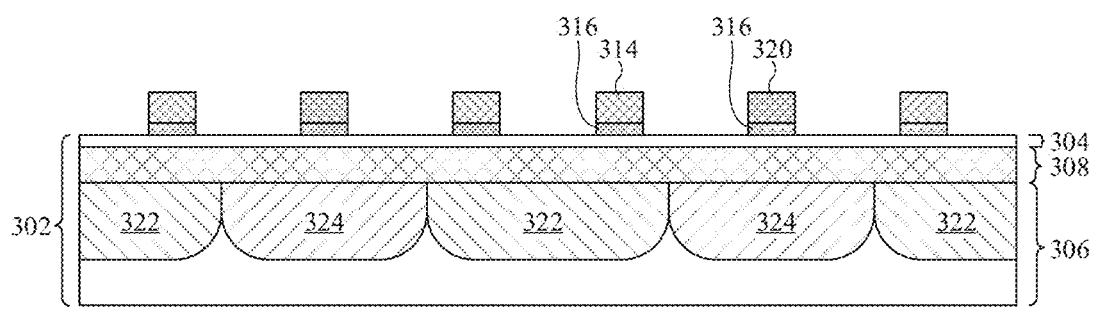

As shown in FIG. 7, a plurality of gate electrodes 314 and a plurality of dummy gates 320 are formed over a plurality of gate dielectrics 316. The gate dielectrics 316 are formed on the first semiconductor material layer 304 and respectively separate the gate electrodes 314 and the dummy gates 320 from the first semiconductor material layer 304. In various embodiments, the gate electrodes 314 and the dummy gates 320 may comprise, for example, doped polysilicon, tungsten, aluminum, or some other conductive material. In some embodiments, the gate dielectrics 316 may comprise, for example, an oxide, a high-k dielectric, or some other insulating material.

In various embodiments, the gate electrodes 314, the dummy gates 320, and the gate dielectrics 316 may be formed by growing and/or depositing (e.g., by chemical vapor deposition (CVD), physical vapor deposition (PVD), atomic layer deposition (ALD), thermal oxidation, sputtering, etc.) a gate dielectric layer and a conductive gate layer over the first semiconductor material layer 304. Subsequently, the gate dielectric layer and the conductive gate electrode are patterned and etched to form the gate electrodes 314, the dummy gates 320, and the gate dielectrics 316.

Figure 8:
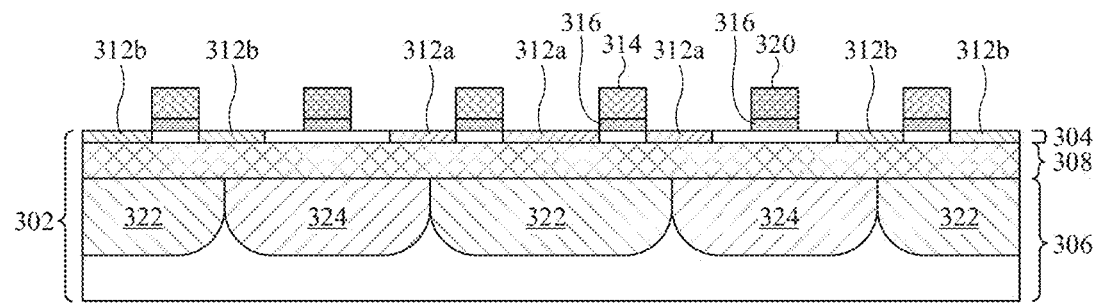

As shown in FIG. 8, a plurality of first source/drain regions 312a and a plurality of second source/drain regions 312b are formed in the first semiconductor material layer 304. The first source/drain regions 312a are regions of the first semiconductor material layer 304 comprising the first doping type (e.g., p-type doping). The second source/drain regions 312b are regions of the first semiconductor material layer 304 comprising the second doping type (e.g., n-type doping). In some embodiments, the first source/drain regions 312a and the second source/drain regions 312b are formed directly over respective biasing wells 322.

In various embodiments, the first source/drain regions 312a may be formed by a first ion implantation process and may utilize a masking layer (not shown) to selectively implant ions into the first semiconductor material layer 304. In some embodiments, the second source/drain regions 312b may be formed by a second ion implantation process and may utilize a masking layer (not shown) to selectively implant ions into the first semiconductor material layer 304. In further embodiments, the first source/drain regions 312a or the second source/drain regions 312b may be formed by a self-aligned ion implantation process that utilizes the gate electrodes 314 and/or the dummy gates 320 as a mask.

Figure 9:
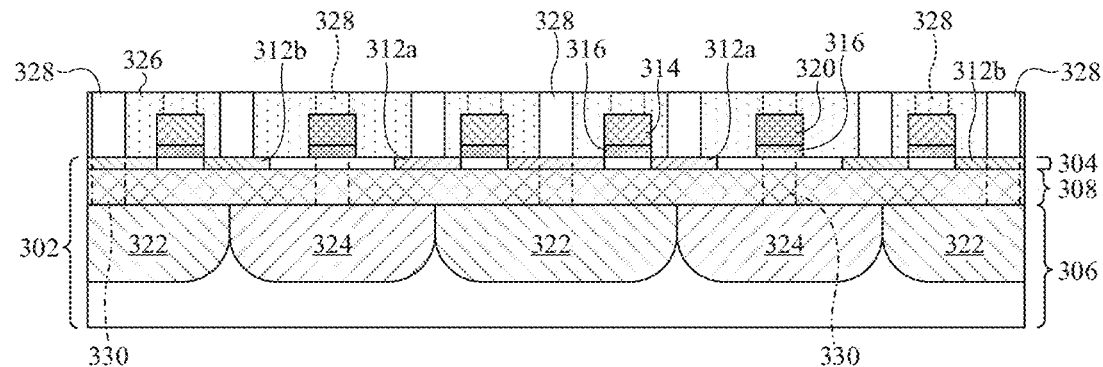

As shown in FIG. 9, an interlayer dielectric (ILD) layer 326 is formed over the first semiconductor material layer 304, the first source/drain region 312a, the second source/drain regions 312b, the gate electrodes 314, and the dummy gates 320. The ILD layer 326 may be formed with a substantially planar upper surface and may comprise an oxide, a nitride, a low-k dielectric, or some other dielectric. In some embodiments, the ILD layer 326 may be formed by CVD, PVD, ALD, sputtering, or some other deposition or growth process. In further embodiments, a planarization process (e.g., a chemical-mechanical planarization (CMP)) may be performed on the ILD layer 326 to form the substantially planar upper surface.

Also illustrated by FIG. 9, a plurality of contacts 328 are formed in the ILD layer 326 that respectively extend though the ILD layer 326 to the first source/drain regions 312a, the second source/drain regions 312b, the gate electrodes 314, and the dummy gates 320. In some embodiments, the contacts 328 may not extend through the ILD layer 326 to the dummy gates 320. In further embodiments, a process for forming the contacts 328 comprises performing an etch into the ILD layer 326 to form contact openings that correspond to the contacts 328. In some embodiments, the etch may be performed with a patterned masking layer formed over the ILD layer 326. In further embodiments, the contact openings may be filled by depositing or growing a conductive material (e.g., tungsten) covering the ILD layer 326 that fills the contact openings, and subsequently performing a planarization (e.g., CMP) on the contacts 328 and ILD layer 326.

Also illustrated by FIG. 9, a plurality of body contacts 330 are formed in the ILD layer 326 that respectively extend through the ILD layer 326, through the first semiconductor material layer 304, and through the insulating layer 308 to the biasing wells 322 and the isolation wells 324. In further embodiments, a process for forming the body contacts 330 comprises performing an etch into the ILD layer 326 to form body contact openings that correspond to the body contacts 330. In some embodiments, the etch may be performed with a patterned masking layer formed over the ILD layer 326. In further embodiments, the body contact openings may be filled by depositing or growing a conductive material (e.g., tungsten) covering the ILD layer 326 that fills the body contact openings, and subsequently performing a planarization (e.g., CMP) on the body contacts 330 and ILD layer 326. In yet further embodiments, the body contact openings are formed at the same time the contact openings are formed, and the conductive material covering the ILD layer 326 may fill both the contact openings and the body contact openings. In such an embodiment, the planarization (e.g., CMP) may be performed on the contacts 328, the body contacts 330, and the ILD layer 326.

Figure 10:
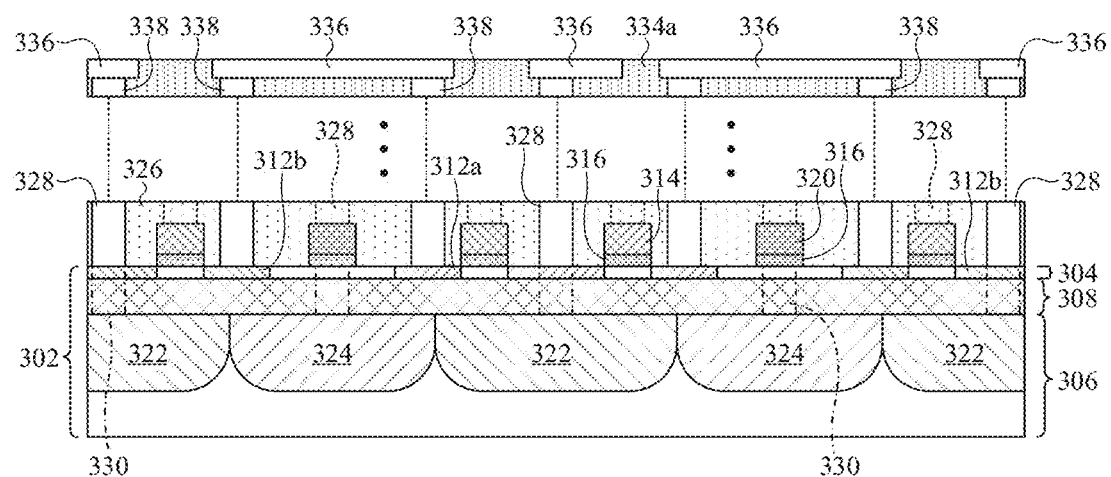

As shown in FIG. 10, a first inter-metal dielectric (IMD) layer 334a is formed over the ILD layer 326. In some embodiments, the first IMD layer 334a may be deposited or grown on the ILD layer 326 by, for example, CVD, PVD, ALD, sputtering, or some other deposition or growth process. In further embodiments, a planarization process (e.g., CMP) may be performed on the first IMD layer 334a to form a substantially planar upper surface. In some embodiments, the first IMD layer 334a may comprise, for example, a low-k dielectric layer, an ultra-low-k dielectric layer, or an oxide.

Also shown in FIG. 10, a plurality of conductive wires 336 and a plurality of conductive vias 338 are formed within the first IMD layer 334a. In some embodiments, a first one of the conductive vias 338 couples one of the second source/drain regions 312b to one of the conductive wires 336. Further, a second one of the conductive vias 338 couples one of the first source/drain regions 312a to the one of the conductive wires 336, such that both the one of the second source/drain regions 312b and the one of the first source/drain regions 312a are electrically coupled to the one of the conductive wires 336.

In some embodiments, a process for forming the conductive wires 336 and the conductive vias 338 in the IMD layer 334 comprises performing an etch into the first IMD layer 334a to form via openings and conductive wire openings that respectively correspond to the conductive vias 338 and the conductive wires 336. In some embodiments, the etch may be performed with a patterned masking layer formed over the first IMD layer 334a. In further embodiments, the openings may be filled by depositing or growing a conductive layer covering the first IMD layer 334a that fills the openings, and subsequently performing a planarization (e.g., CMP) on the first IMD layer 334a. In yet further embodiments, the conductive layer may comprise, for example, copper, aluminum, or some other conductive material.

Figure 11:
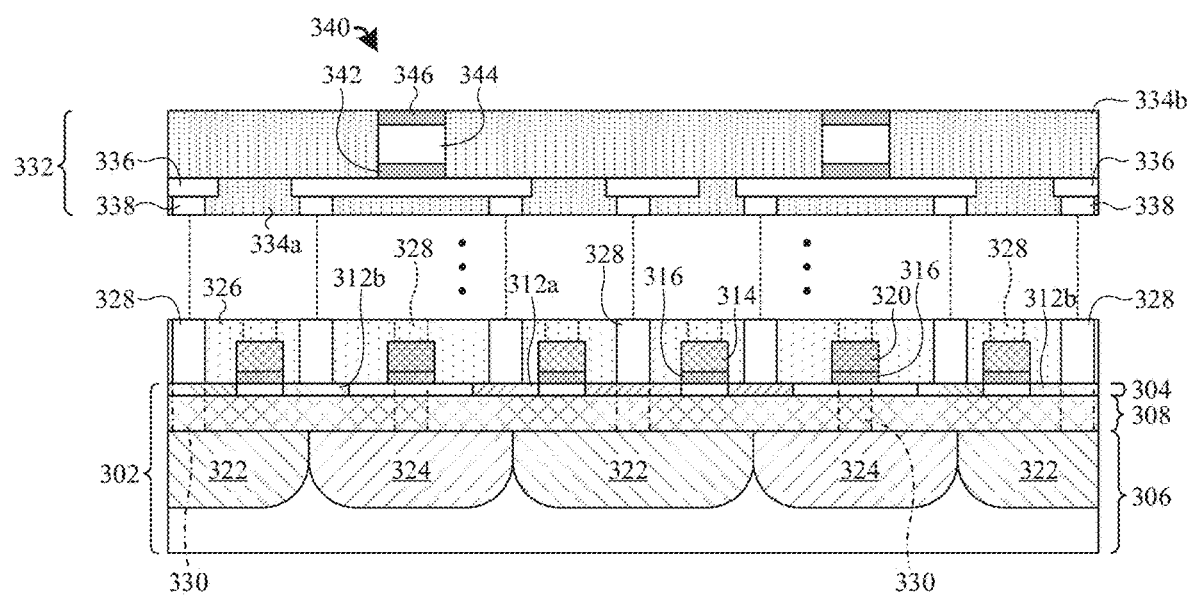

As shown in FIG. 11, a plurality of resistive memory cells 340 are formed in a second IMD layer 334b. In some embodiments, the second IMD layer 334b may comprise, for example, a low-k dielectric layer, an ultra-low-k dielectric layer, or an oxide. In further embodiments, the resistive memory cells 340 are configured to store data based on a resistive state of the resistive memory cell 340. In yet further embodiments, the resistive memory cell 340 may comprise a bottom electrode 342, a data storage structure 344, and an upper electrode 346. In some embodiments, the bottom electrode 342 of one of the resistive memory cells 340 may be coupled to the one of the conductive wires 336, such that the one of the second source/drain regions 312b and the one of the first source/drain regions 312a are electrically coupled to the bottom electrode 342 of one of the resistive memory cells 340.

In some embodiments, a process for forming the resistive memory cells 340 comprises depositing or growing a bottom electrode layer over the first IMD layer 334a, a data storage layer over the bottom electrode layer, and an upper electrode layer over the data storage layer. In some embodiments, the bottom electrode layer, the data storage layer, and the upper electrode layer may be deposited or grown by, for example, CVD, PVD, ALD, sputtering, electrochemical plating, electroless plating, or some other deposition or growth process. An etch is performed into the bottom electrode layer, the data storage layer, and the upper electrode layer to respectively form a plurality of bottom electrodes 342 over the first IMD layer 334a, a plurality of data storage structures 344 over the bottom electrodes 342, and a plurality of upper electrodes 346 over the data storage structures 344. In some embodiments, the etch may be performed with a patterned masking layer formed over the upper electrode layer. Subsequently, the second IMD layer 334b is formed over the resistive memory cells 340, the first IMD layer 334a, and the conductive wires 336. In some embodiments, the second IMD layer 334b may be formed by, for example, CVD, PVD, ALD, sputtering, or some other deposition or growth process. In further embodiments, a planarization process (e.g., CMP) may be performed on the second IMD layer 334b and the upper electrodes 346 to form a substantially planar upper surface. Although not shown, additional IMD layers 334a-b, additional conductive wires 336, and additional conductive vias 338 may be formed between the ILD layer 326 and the first IMD layer 334a and/or over the second IMD layer 334b.

In some embodiments, the bottom electrode layer and the upper electrode layer may comprise, for example, copper, aluminum, tungsten, or some other suitable conductor. In some embodiments, the data storage layer may comprise, for example, a chalcogenide, an oxide, a nitride, a high-k dielectric, or some other suitable dielectric. In further embodiments, the data storage layer may comprise multiple layers configured to store data based on a resistive state of one or more of the multiple layers. For example, the data storage layer may comprise a first ferromagnetic layer (e.g., iron, cobalt, etc.) separated from a second ferromagnetic layer (e.g., iron, cobalt, etc.) by an insulating layer (e.g., germanium oxide, magnesium oxide, etc.) that are etched to form a magnetic tunnel junction (MTJ).

Figure 12:
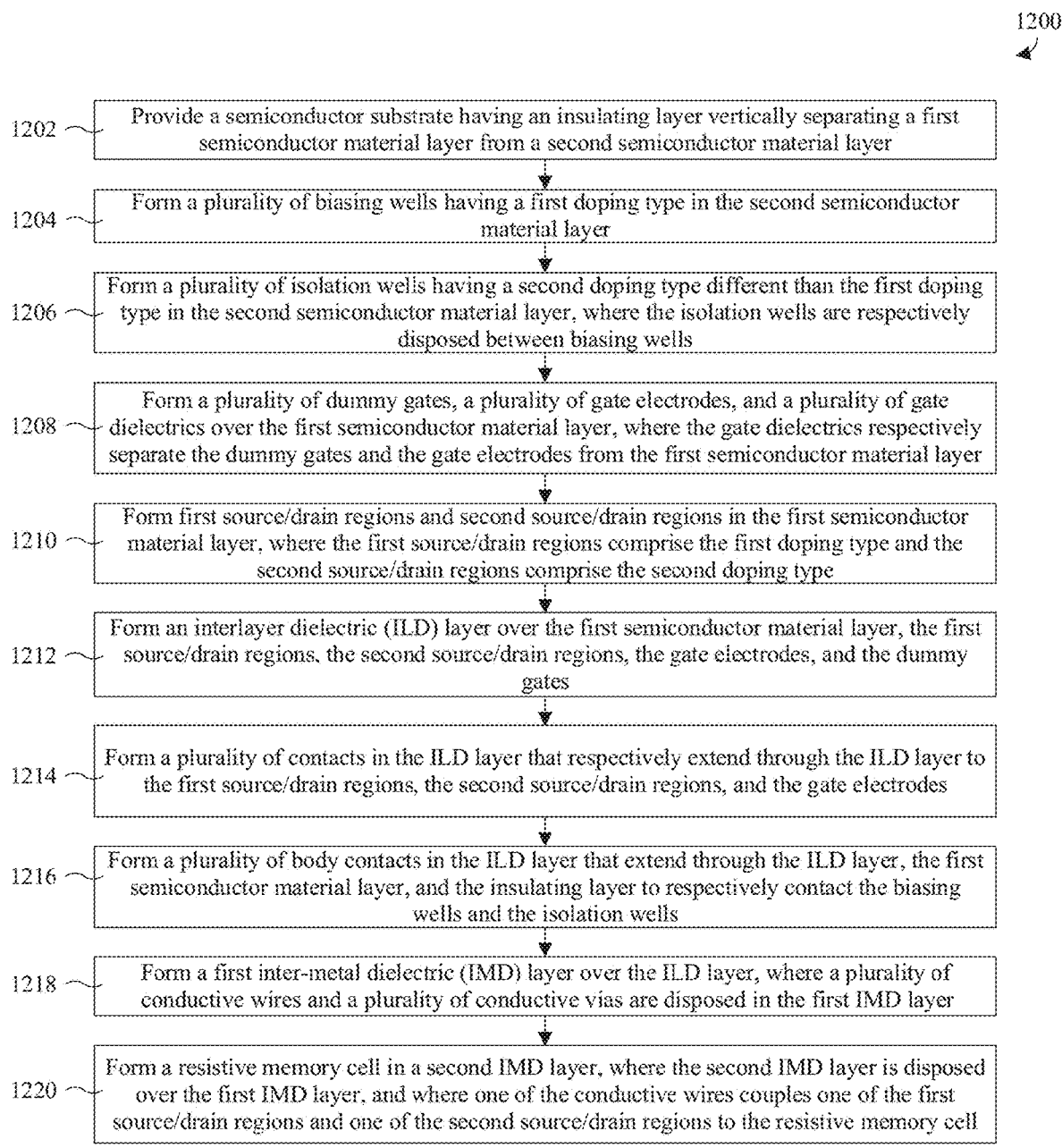
FIG. 12 illustrates a flowchart of some embodiments of a method for forming an integrated circuit (IC) having a two transistor-one memory cell (2T1MC) device, where a first access transistor has first source/drain regions having a different doping type than second source/drain regions of a second access transistor.

As illustrated in FIG. 12, a flowchart 1200 of some embodiments of a method for forming an integrated circuit (IC) having a two transistor-one memory cell (2T1MC) where a first access transistor has first source/drain regions having a different doping type than second source/drain regions of a second access transistor, is provided. While the flowchart 1200 of FIG. 12 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1202, a semiconductor substrate having an insulating layer vertically separating a first semiconductor material layer from a second semiconductor material layer is provided. FIG. 5 illustrates a cross-sectional view of some embodiments corresponding to act 1202.

At 1204, a plurality of biasing wells having a first doping type are formed in the second semiconductor material layer. FIG. 5 illustrates a cross-sectional view of some embodiments corresponding to act 1204.

At 1206, a plurality of isolation wells having a second doping type different than the first doping type are formed in the second semiconductor material layer, where the isolation wells are respectively disposed between biasing wells. FIG. 6 illustrates a cross-sectional view of some embodiments corresponding to act 1206.

At 1208, a plurality of dummy gates, a plurality of gate electrodes, and a plurality of gate dielectrics are formed over the first semiconductor material layer, where the gate dielectrics respectively separate the dummy gates and the gate electrodes from the first semiconductor material layer. FIG. 7 illustrates a cross-sectional view of some embodiments corresponding to act 1208.

At 1210, first source/drain regions and second source/drain regions are formed in the first semiconductor material layer, where the first source/drain regions comprise the first doping type and the second source/drain regions comprise the second doping type. FIG. 8 illustrates a cross-sectional view of some embodiments corresponding to act 1210.

At 1212, an interlayer dielectric (ILD) layer is formed over the first semiconductor material layer, the first source/drain regions, the second source/drain regions, the gate electrodes, and the dummy gates. FIG. 9 illustrates a cross-sectional view of some embodiments corresponding to act 1212.

At 1214, a plurality of contacts are formed in the ILD layer that respectively extend through the ILD layer to the first source/drain regions, the second source/drain regions, and the gate electrodes. FIG. 9 illustrates a cross-sectional view of some embodiments corresponding to act 1214.

At 1216, a plurality of body contacts are formed in the ILD layer that extend through the ILD layer, the first semiconductor material layer, and the insulating layer to respectively contact the biasing wells and the isolation wells. FIG. 9 illustrates a cross-sectional view of some embodiments corresponding to act 1216.

At 1218, a first inter-metal dielectric (IMD) layer is formed over the ILD layer, where a plurality of conductive wires and a plurality of conductive vias are disposed in the first IMD layer. FIG. 10 illustrates a cross-sectional view of some embodiments corresponding to act 1218.

At 1220, a resistive memory cell is formed in a second IMD layer, where the second IMD layer is disposed over the first IMD layer, and where one of the conductive wires couples one of the first source/drain regions and one of the second source/drain regions to the resistive memory cell.

FIG. 11 illustrates a cross-sectional view of some embodiments corresponding to act 1220.

In some embodiments, the present application provides a semiconductor device. The semiconductor device includes a semiconductor substrate having a first semiconductor material layer separated from a second semiconductor material layer by an insulating layer. A first access transistor is disposed on the first semiconductor material layer, where the first access transistor has a pair of first source/drain regions having a first doping type. A second access transistor is disposed on the first semiconductor material layer, where the second access transistor has a pair of second source/drain regions having a second doping type opposite the first doping type. A first resistive memory cell having a first bottom electrode and a first upper electrode is disposed over the semiconductor substrate, where one of the first source/drain regions and one of the second source/drain regions are electrically coupled to the first bottom electrode.

In other embodiments, the present application provides a semiconductor device. The semiconductor device includes a first access transistor disposed on a semiconductor substrate, where the first access transistor includes a pair of first source/drain regions having a first doping type. A first well having the first doping type is disposed in the semiconductor substrate beneath the first access transistor. A second access transistor is disposed on the semiconductor substrate, where the second access transistor includes a pair of second source/drain regions having a second doping type different than the first doping type. A second well having the first doping type is disposed in the semiconductor substrate beneath the second access transistor. A first resistive memory cell having a bottom electrode and an upper electrode is disposed over the semiconductor substrate, where one of the first source/drain regions and one of the second source/drain regions are electrically coupled to the bottom electrode.

In yet other embodiments, the present application provides a method for changing a resistance of a memory cell. The method includes applying a n-type channel metal-oxide-semiconductor (NMOS) gate voltage to a NMOS gate terminal to form a first conductive path between source/drain terminals of a NMOS transistor. A p-type channel metal-oxide-semiconductor (PMOS) gate voltage is applied to a PMOS gate terminal to form a second conductive path between source/drain terminals of a PMOS transistor. A first body bias voltage is applied to a NMOS body terminal of the NMOS transistor. A second body bias voltage is applied to a PMOS body terminal of the PMOS transistor, where the second body bias voltage is less than the first body bias voltage. A write current is passed through both the first conductive path and the second conductive path to a resistive memory cell, where the write current changes the resistance of the resistive memory cell from a first resistance to a second resistance that is different than the first resistance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor substrate comprising a first semiconductor material layer separated from a second semiconductor material layer by an insulating layer;
    a first access transistor disposed on the first semiconductor material layer, wherein the first access transistor comprises a pair of first source/drain regions having a first doping type;
    a second access transistor disposed on the first semiconductor material layer, wherein the second access transistor comprises a pair of second source/drain regions having a second doping type opposite the first doping type;
    a first resistive memory cell comprising a first bottom electrode and a first upper electrode disposed over the semiconductor substrate, wherein one of the first source/drain regions and one of the second source/drain regions are electrically coupled to the first bottom electrode;
    an interlayer dielectric (ILD) layer disposed over the first semiconductor material layer, the first access transistor, and the second access transistor;
    a first conductive contact disposed in the ILD layer, wherein the first conductive contact extends through the ILD layer to the one of the first source/drain regions;
    a second conductive contact disposed in the ILD layer, wherein the second conductive contact extends through the ILD layer to the one of the second source/drain regions;
    an interconnect structure disposed over the ILD layer, the first conductive contact, and the second conductive contact; and
    a conductive line disposed in the interconnect structure, wherein the conductive line is electrically coupled to the first conductive contact, the second conductive contact, and the first bottom electrode of the first resistive memory cell.

2. The semiconductor device of claim 1, further comprising:
    a first well disposed in the second semiconductor material layer directly beneath the first access transistor; and
    a second well disposed in the second semiconductor material layer directly beneath the second access transistor.

3. The semiconductor device of claim 2, wherein the first well and the second well comprise the first doping type.

4. The semiconductor device of claim 3, further comprising:
    an isolation well comprising the second doping type disposed in the second semiconductor material layer, wherein the isolation well separates the first well from the second well.

5. The semiconductor device of claim 4, further comprising:
    a first body contact vertically extending through the first semiconductor material layer and the insulating layer to the first well;
    a second body contact vertically extending through the first semiconductor material layer and the insulating layer to the second well; and a third body contact vertically extending through the first semiconductor material layer and the insulating layer to the isolation well.

6. The semiconductor device of claim 5, wherein the first resistive memory cell is a magnetoresistive random-access memory (MRAM) cell.

7. The semiconductor device of claim 1, further comprising:
- a third access transistor disposed on the first semiconductor material layer, wherein the third access transistor comprises a pair of third source/drain regions having the first doping type;
- a fourth access transistor disposed on the first semiconductor material layer, wherein the fourth access transistor comprises a pair of fourth source/drain regions having the second doping type; and
- a second resistive memory cell comprising a second bottom electrode and a second upper electrode disposed over the semiconductor substrate, wherein one of the third source/drain regions and one of the fourth source/drain regions are electrically coupled to the second bottom electrode, and wherein another one of the third source/drain regions is electrically coupled to another one of the first source/drain regions.

8. The semiconductor device of claim 7, wherein the third access transistor and the first access transistor share a common source/drain region that comprises the another one of the third source/drain regions and the another one of the first source/drain regions.

9. The semiconductor device of claim 8, further comprising:
- a first well having the first doping type disposed in the second semiconductor material layer directly beneath the first access transistor and the third access transistor; and
- a second well having the first doping type disposed in the second semiconductor material layer directly beneath the second access transistor; and
- a third well having the first doping type disposed in the second semiconductor material layer directly beneath the fourth access transistor.

10. The semiconductor device of claim 9, further comprising:
- a first isolation well having the second doping type disposed in the second semiconductor material layer, wherein the first isolation well separates the first well from the second well; and
- a second isolation well having the second doping type disposed in the second semiconductor material layer, wherein the second isolation well separates the first well from the third well.

11. The semiconductor device of claim 10, further comprising:
- a first dummy gate disposed over the first isolation well and between the first access transistor and the second access transistor; and
- a second dummy gate disposed over the second isolation well and between the third access transistor and the fourth access transistor.

12. A semiconductor device, comprising:
- a semiconductor substrate, wherein the semiconductor substrate comprises a first semiconductor material layer separated from a second semiconductor material layer by an insulating layer;
- a first well having a first doping type disposed in the second semiconductor material layer;
- a second well having the first doping type disposed in the second semiconductor material layer; and
- a third well having a second doping type opposite the first doping type disposed in the second semiconductor material layer and between the first well and the second well;
- a p-channel channel metal-oxide-semiconductor (PMOS) transistor disposed over the semiconductor substrate, wherein a gate electrode of the PMOS transistor is disposed directly over the first well;
- a n-channel metal-oxide-semiconductor (NMOS) transistor disposed over the semiconductor substrate and laterally spaced from the PMOS transistor, wherein a gate electrode of the NMOS transistor is disposed directly over the second well, and wherein the third well is laterally disposed between the gate electrode of the PMOS transistor and the gate electrode of the NMOS transistor; and
- a resistive memory cell comprising a first electrode and a second electrode disposed over the semiconductor substrate, wherein both a source/drain region of the PMOS transistor and a source/drain region of the NMOS transistor are electrically coupled to the first electrode.

13. The semiconductor device of claim 12, wherein:
- the source/drain region of the PMOS transistor has a first side and a second side opposite the first side;
- a third side of the third well is disposed between the first side and the second side;
- the source/drain region of the NMOS transistor has a fourth side and a fifth side opposite the fourth side; and
- a sixth side of the third well is disposed between the fourth side and the fifth side.

14. A semiconductor device, comprising:
- a semiconductor substrate comprising a first semiconductor material layer separated from a second semiconductor material layer by an insulating layer;
- a first access transistor disposed on the first semiconductor material layer, wherein the first access transistor comprises a pair of first source/drain regions having a first doping type;
- a second access transistor disposed on the first semiconductor material layer, wherein the second access transistor comprises a pair of second source/drain regions having a second doping type opposite the first doping type;
- a third access transistor disposed on the first semiconductor material layer, wherein the third access transistor comprises a pair of third source/drain regions having the first doping type;
- a fourth access transistor disposed on the first semiconductor material layer, wherein the fourth access transistor comprises a pair of fourth source/drain regions having the second doping type
- a first resistive memory cell comprising a first bottom electrode and a first upper electrode disposed over the semiconductor substrate, wherein one of the first source/drain regions and one of the second source/drain regions are electrically coupled to the first bottom electrode; and
- a second resistive memory cell comprising a second bottom electrode and a second upper electrode disposed over the semiconductor substrate, wherein one of the third source/drain regions and one of the fourth source/drain regions are electrically coupled to the second bottom electrode, and wherein another one of the third source/drain regions is electrically coupled to another one of the first source/drain regions.

15. The semiconductor device of claim 14, further comprising:
- an interlayer dielectric (ILD) layer disposed over the first semiconductor material layer, the first access transistor, and the second access transistor;
- a first conductive contact disposed in the ILD layer, wherein the first conductive contact extends through the ILD layer to the one of the first source/drain regions;
- a second conductive contact disposed in the ILD layer, wherein the second conductive contact extends through the ILD layer to the one of the second source/drain regions;
- an interconnect structure disposed over the ILD layer, the first conductive contact, and the second conductive contact; and
- a conductive line disposed in the interconnect structure, wherein the conductive line is electrically coupled to the first conductive contact, the second conductive contact, and the first bottom electrode of the first resistive memory cell.

16. The semiconductor device of claim 14, further comprising:
- a first well disposed in the second semiconductor material layer and beneath the first access transistor; and
- a second well disposed in the second semiconductor material layer and beneath the second access transistor, wherein the first well and the second well comprise the first doping type.

17. The semiconductor device of claim 16, further comprising:
- an isolation well comprising the second doping type disposed in the second semiconductor material layer, wherein the isolation well separates the first well from the second well.

18. The semiconductor device of claim 17, further comprising:
- a first body contact vertically extending through the first semiconductor material layer and the insulating layer to the first well;
- a second body contact vertically extending through the first semiconductor material layer and the insulating layer to the second well; and
- a third body contact vertically extending through the first semiconductor material layer and the insulating layer to the isolation well.

19. The semiconductor device of claim 17, wherein the one of the first source/drain regions at least partially overlies both the first well and the isolation well.

20. The semiconductor device of claim 19, wherein the one of the second source/drain regions at least partially overlies both the second well and the isolation well.

* * * * *